(12) United States Patent
Marchant et al.

(10) Patent No.: US 7,936,007 B2
(45) Date of Patent: May 3, 2011

(54) LDMOS WITH SELF ALIGNED VERTICAL LDD BACKSIDE DRAIN

(75) Inventors: Bruce D. Marchant, Murray, UT (US); Daniel M. Kinzer, El Segundo, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/425,349

(22) Filed: Apr. 16, 2009

(65) Prior Publication Data

US 2010/0264490 A1 Oct. 21, 2010

(51) Int. Cl.
*H01L 29/76* (2006.01)
*H01L 29/94* (2006.01)
(52) U.S. Cl. ......... 257/328; 257/330; 257/335; 438/212
(58) Field of Classification Search .................. 257/328, 257/330, 335–336, 341, E29.257, E21.629; 438/212, 268
See application file for complete search history.

(56) References Cited

U.S. PATENT DOCUMENTS

| 7,589,378 B2 * | 9/2009 | Kocon et al. .................. 257/343 |
| 2003/0089947 A1 * | 5/2003 | Kawaguchi et al. .......... 257/341 |
| 2007/0013008 A1 | 1/2007 | Xu et al. |
| 2007/0138548 A1 | 6/2007 | Kocon et al. |

* cited by examiner

*Primary Examiner* — Theresa T Doan
(74) *Attorney, Agent, or Firm* — Kilpatrick Townsend and Stockton LLP (57) ABSTRACT

A field effect transistor includes a semiconductor region of a first conductivity type having an upper surface and a lower surface, the lower surface of the semiconductor region extending over and abutting a substrate. A well regions of a second conductivity type is disposed within the semiconductor region. The field effect transistor also includes source regions of the first conductivity type disposed in the well regions and a gate electrode extending over each well region and overlapping a corresponding one of the source regions. Each gate electrode is insulated from the underlying well region by a gate dielectric. At least one LDD region of the first conductivity type is disposed in the semiconductor region between every two adjacent well regions such that the at least one LDD region is in contact with the two adjacent well regions between which it is disposed. A sinker region is disposed in the semiconductor region directly underneath the at least one LDD region such that the at least one LDD region and the sinker region are positioned along a vertical orientation between the upper and lower surfaces of the semiconductor region.

12 Claims, 8 Drawing Sheets

LDMOS WITH SELF ALIGNED VERTICAL LDD BACKSIDE DRAIN

BACKGROUND OF THE INVENTION

Embodiments of the invention relate to field effect transistors such as MOSFETs (metal oxide semiconductor field effect transistors) and methods for making field effect transistors.

Laterally Diffused MOS (LDMOS) structures are widely used in high voltage transistors. LDMOS transistors can provide wide frequency range, high linearity, good ruggedness performance, and high breakdown voltages. A conventional LDMOS transistor has its contacted source and drain regions near the surface of the semiconductor wafer, and thus, the current flow in the transistor is more or less along the lateral dimension. In an alternative design, LDMOS transistors have drain contacts along the backside of the die. LDMOS transistors with backside drain typically have a structure arranged in a horizontal sequence of source, polysilicon gate, lightly doped drain (LDD), and sinker region. This arrangement tends to result in a large device size. On the drain side of the transistor, the LDD region is often extended laterally to obtain high voltage. Moreover, the sinker region needs to be diffused sufficiently to reach the backside drain. Such deep diffusion tends to consume additional die area due to side diffusion and misalignment.

Thus, there is a need for a LDMOS structure with a small cell pitch and superior transistor performance, which can be formed using a simple manufacturing process.

BRIEF SUMMARY OF THE INVENTION

In accordance with embodiments of the present invention, various techniques are described for reducing cell pitch and on-resistance $R_{DS(on)}$ in LDMOS transistors. Embodiments of the present invention also provide simple and cost-effective method for making LDMOS transistors.

In accordance with one embodiment of the present invention, a field effect transistor includes a semiconductor region of a first conductivity type having an upper surface and a lower surface, the lower surface of the semiconductor region extending over and abutting a substrate. A well regions of a second conductivity type is disposed within the semiconductor region. The field effect transistor also includes source regions of the first conductivity type disposed in the well regions and a gate electrode extending over each well region and overlapping a corresponding one of the source regions. Each gate electrode is insulated from the underlying well region by a gate dielectric. At least one LDD region of the first conductivity type is disposed in the semiconductor region between every two adjacent well regions such that the at least one LDD region is in contact with the two adjacent well regions between which it is disposed. A sinker region is disposed in the semiconductor region directly underneath the at least one LDD region such that the at least one LDD region and the sinker region are positioned along a vertical orientation between the upper and lower surfaces of the semiconductor region. The sinker region having a higher dopant concentration than the at least one LDD region.

In one embodiment, the at least one LDD region is self-aligned to gate electrodes between which it is disposed.

In another embodiment, the sinker region is fully embedded in the semiconductor region so that it does not reach the upper surface of the semiconductor region.

In another embodiment, the semiconductor region includes two or more epitaxial layers.

In another embodiment, the semiconductor region includes an upper epitaxial layer and a lower epitaxial layer having different dopant concentrations.

In another embodiment, a portion of the sinker region extends laterally in the semiconductor region directly underneath the gate electrode.

In another embodiment, the at least one LDD region forms an upper LDD region, and the field effect transistor further includes a lower LDD region of the first conductivity type disposed in the semiconductor region directly underneath the upper LDD region and directly above the sinker region.

In another embodiment, the lower LDD region has a higher dopant concentration than the upper LDD region, and is self-aligned to gate electrodes between which it is disposed.

In accordance with another embodiment of the present invention, a field effect transistor includes a semiconductor region of a first conductivity type having an upper surface and a lower surface, with the lower surface of the semiconductor region extending over and abutting a substrate. A well region of a second conductivity type is disposed within the semiconductor region, with a source region of the first conductivity type disposed in the well region. The field effect transistor also has a gate electrode extending over the well region and overlapping the source region, and the gate electrode is insulated from the well region by a gate dielectric. An upper LDD region of the first conductivity type is disposed in the semiconductor region adjacent to and in contact with the well region, and a lower LDD region of the first conductivity type is disposed in the semiconductor region directly underneath but in contact with the upper LDD region. Both the upper LDD region and the lower LDD region are self-aligned to the gate electrode. Moreover, a sinker region is disposed in the semiconductor region directly underneath but in contact with the lower LDD region such that the upper and lower LDD regions and the sinker region are positioned along a vertical orientation between the upper and lower surfaces of the semiconductor region. In an embodiment, the sinker region has a higher dopant concentration than the upper and lower LDD regions.

In one embodiment of the above field effect transistor, the sinker region is fully embedded in the semiconductor region so that it does not reach the upper surface of the semiconductor region.

In another embodiment, the semiconductor region includes an upper epitaxial layer and a lower epitaxial layer, with the upper epitaxial layer having a lower doping concentration than the lower epitaxial layer, and the lower epitaxial layer having a lower doping concentration than the substrate.

In another embodiment, the sinker region extends through both the upper and lower epitaxial layers, and both the upper and lower LDD regions extend in the upper epitaxial layer only.

In another embodiment, a portion of the sinker region extends laterally in the semiconductor region directly underneath the gate electrode.

In accordance with an alternative embodiment of the present invention, a method for forming a field effect transistor includes the following steps. First, a semiconductor region of a first conductivity type having an upper surface and a lower surface is formed, with the lower surface of the semiconductor region extending over and abutting a substrate. The semiconductor region includes a sinker region of the first conductivity type. The method includes forming gate electrodes over the semiconductor region, forming well regions of a second conductivity type in the semiconductor region, and forming source regions of the first conductivity type in the well regions. At least one LDD region is formed in the semiconductor region between every two adjacent well regions such that the at least one LDD region is in contact with the two adjacent well regions between which it is disposed.

In one embodiment of the above method, the sinker region is fully embedded in the semiconductor region so that it does not reach the upper surface of the semiconductor region.

In another embodiment, the semiconductor region includes two or more epitaxial layer.

In another embodiment, forming the semiconductor region includes forming a lower epitaxial layer of the first conductivity over the substrate, selectively implanting dopants of the first conductivity type into the lower epitaxial layer to form an implant region therein, forming an upper epitaxial layer of the first conductivity type overlying the lower epitaxial layer, and performing a temperature cycle whereby dopants in the implant region diffuse up into the upper epitaxial layer, the implant region and the out-diffused region together forming the sinker region.

In another embodiment, the upper epitaxial layer has a lower doping concentration than the lower epitaxial layer, and the lower epitaxial layer has a lower doping concentration than the substrate.

In another embodiment, forming the at least one LDD region comprises implanting dopants of the first conductivity type into the semiconductor region using the gate electrodes as a mask such that the at least one LDD region formed between every two adjacent well regions is self-aligned to corresponding gate electrodes.

In another embodiment, forming the at least one LDD region includes implanting dopants of the first conductivity type to form an upper LDD region in the semiconductor region using the gate electrodes as a mask, and implanting dopants of the first conductivity type to form a lower LDD region in the semiconductor region using the gate electrodes as a mask. The lower LDD region is directly over and in contact with the sinker region, and the upper LDD region is directly over and in contact with the lower LDD region. In some embodiments, the sinker region has a higher doping concentration than the lower LDD region, and the lower LDD region has a higher doping concentration than the upper LDD region.

Various additional features and advantages of the present invention can be further understood with reference to the detailed description and accompanying drawings that follow.

DETAILED DESCRIPTION OF THE INVENTION

Embodiments of the present invention relate to LDMOS transistors having a small cell pitch and low resistance $R_{DS(on)}$. In some embodiments of the present invention, one or more LDD regions are arranged together with the sinker region in a vertical stack, with the LDD region(s) being self-aligned to the gate electrodes. This arrangement substantially reduces the cell pitch: (1) by stacking the LDD region(s) and the sinker region that are typically arranged laterally in conventional LDMOS transistors, and (2) by forming the LDD region in a self-aligned manner thus eliminating the provisions for misalignment that need to be made in conventional LDMOS designs.

In some embodiments, the LDD region(s) and the sinker region are formed between two gate electrodes and are shared by two half cells. The LDD region(s) can be self-aligned to both gate electrodes, and by orienting the LDD region(s) to extend vertically rather than laterally, the LDD region(s) can be formed in the minimum space between the gate electrodes allowed by the lithography capability. In certain embodiments, the sinker region is first implanted in a lower semiconductor layer and then diffused into an upper semiconductor layer, followed by forming one or more LDD regions in the upper semiconductor layer directly on top of the sinker region. The implants and heat cycles are designed to ensure that the sinker region and the overlying LDD region(s) are in contact with one another to ensure reduced $R_{DS(on)}$.

Figure 1:
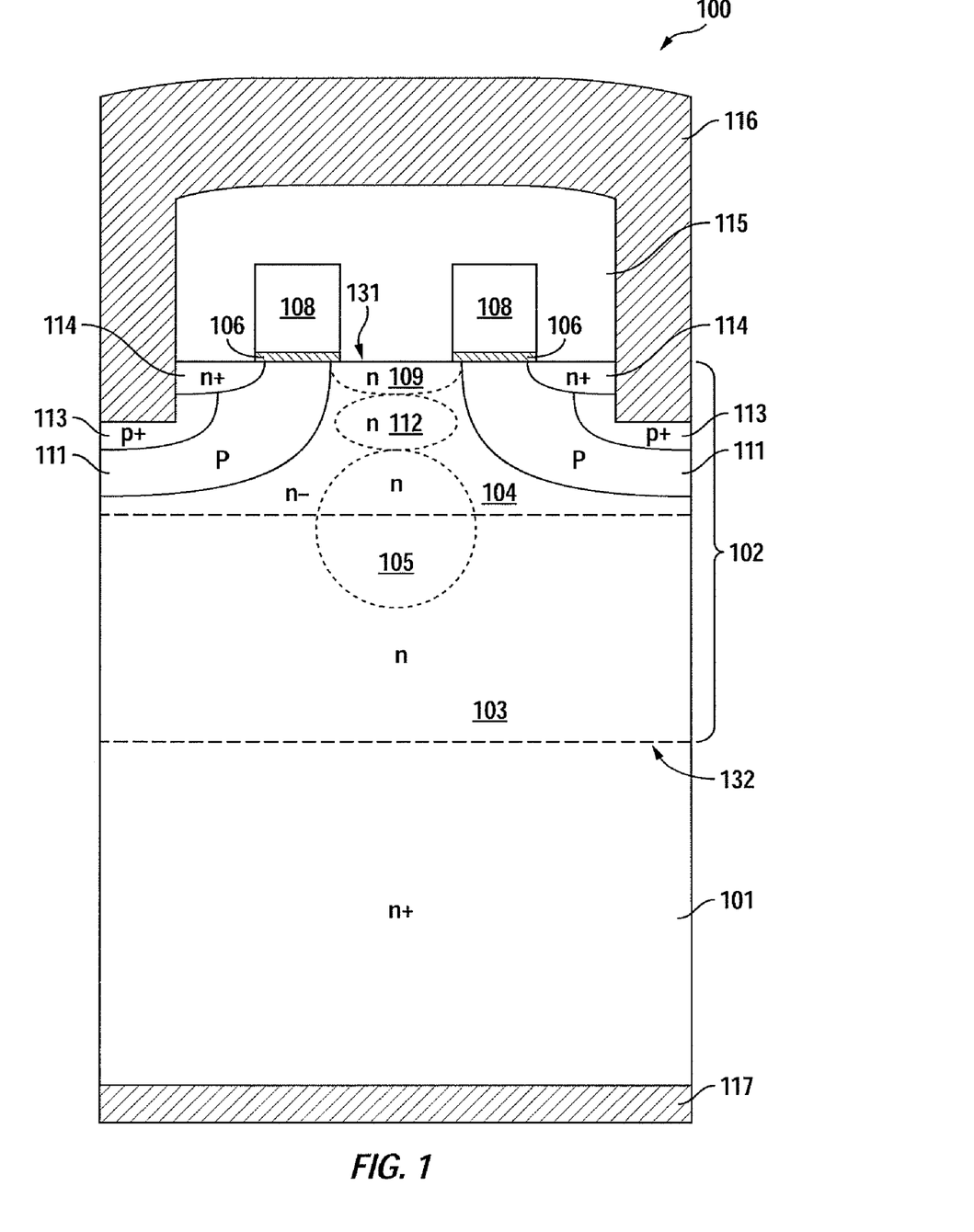
FIG. 1 shows a simplified cross-sectional view of an LDMOS transistor according to an embodiment of the present invention.

FIG. 1 shows a simplified cross-sectional view of an LDMOS transistor 100 according to an embodiment of the present invention. LDMOS transistor 100 includes a semiconductor region 102 with an upper surface 131 and a lower surface 132. Lower surface 132 of semiconductor region 102 extends over and abuts a highly doped substrate 101. In the embodiment shown, semiconductor region 102 includes two epitaxial layers, namely, lower epitaxial layer 103 and upper epitaxial layer 104, however, only one or more than two epitaxial layers may be used depending on the design goals. LDMOS transistor 100 includes well regions 111 extending in semiconductor region 102, and source regions 114 and heavy body regions 113 extending in well regions 111. In the exemplary embodiment shown, substrate 101, semiconductor region 102, and source regions 114 are n-type, whereas well regions 111 and heavy body regions 113 are p-type.

A sinker region 105 is embedded in the semiconductor region 102. One or more LDD regions, e.g., regions 109 and 112, are also formed in semiconductor region 102 and stacked vertically over sinker region 105. The vertical stacking allows the LDD regions to be optimized for reduced resistance and reduced cell pitch. In a specific embodiment, upper LDD region 109 is self-aligned to gate electrodes 108, and is adjacent to and in contact with well regions 111. In embodiments that have a second lower LDD region 112, lower LDD region 112 is disposed in semiconductor region 102 directly underneath upper LDD region 109, and second LDD region 112 is also self-aligned to gate electrodes 108. In the embodiments with only one LDD region 109, the LDD region is in direct contact with sinker 105. In one embodiment, sinker region 105 has a higher dopant concentration than the two LDD regions 109 and 112, and lower LDD region 112 has a higher dopant concentration than upper LDD region 109. This dopant profile results in low RDS(on) and high breakdown voltage.

LDMOS transistor 100 has gate electrodes 108 extending over semiconductor region 102. Each gate electrode 108 is flanked on one side by source region 114 and on the other side by LDD region 109. Gate electrodes 108 extend over well regions 111 and overlap source regions 114 and LDD region 109. gate electrodes 108 are also insulated from the underlying layers by a gate dielectric layer 106. Another dielectric layer 115 may be formed over gate electrodes 108 to insulate gate electrodes 108 from an overlying source interconnect layer 116.

Source interconnect layer 116 (e.g., comprising metal) is formed over dielectric layer 115 and makes contact with source regions 114 and heavy body regions 113. A drain interconnect layer 117 contacts substrate 101 along the backside of transistor 100. During transistor operation, at least a portion of the current flows through the upper and lower LDD regions and the sinker region.

Figure 2:
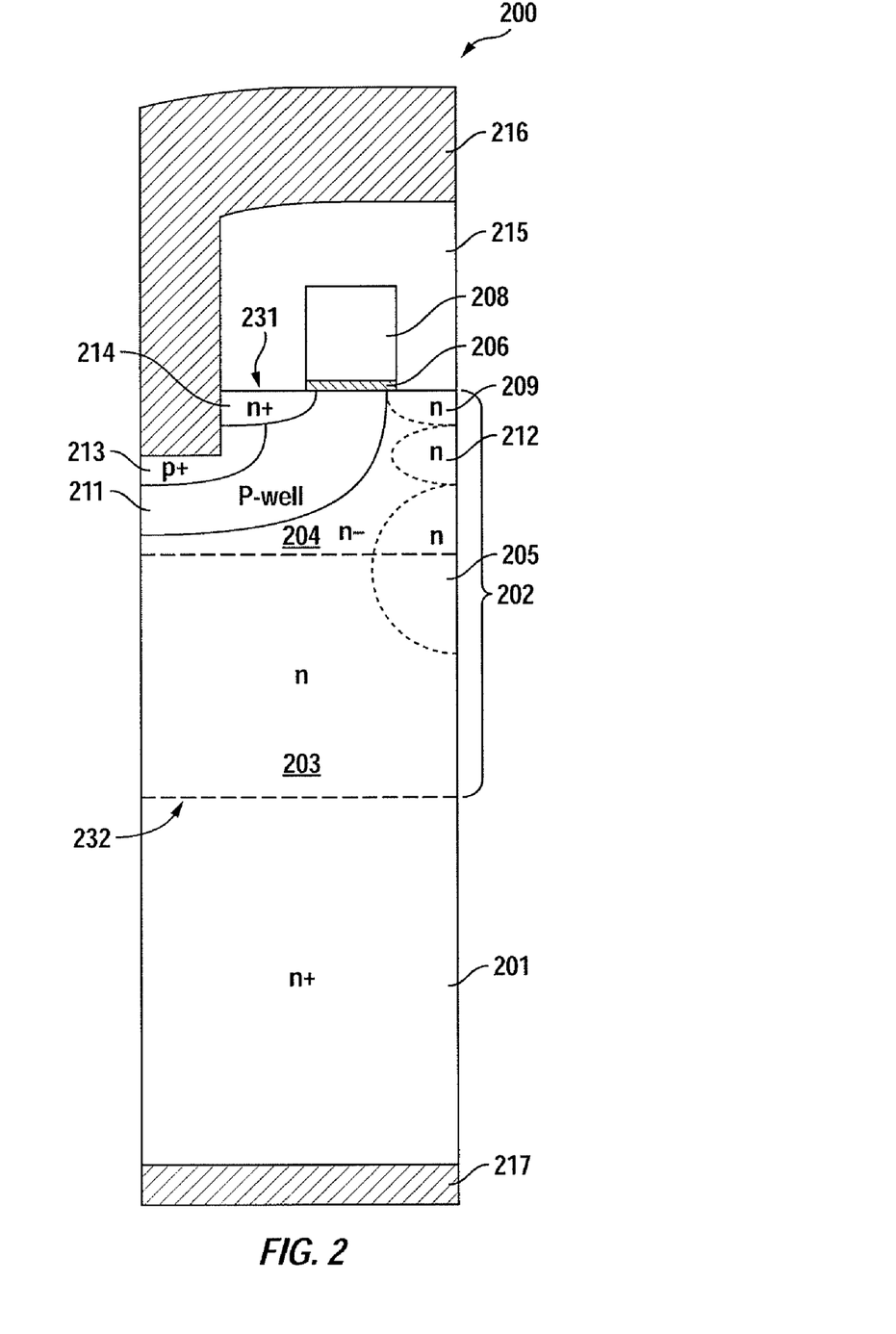
FIG. 2 shows a simplified cross-sectional view of an LDMOS transistor according to another embodiment of the present invention.

FIG. 2 shows a half-cell representation of the LDMOS transistor in FIG. 1, and is otherwise identical to the FIG. 1 structure. According to embodiments of the invention, many variations of the structure shown in FIGS. 1 and 2 are possible. For example, more than two LDD regions can be formed over the sinker region depending on the desired breakdown voltage and $R_{DS(on)}$. These additional LDD regions can be self aligned to the gate electrodes. In some embodiments, the sinker region can also be formed using ion implantation that is self aligned to the gate electrode. Of course, there can be other alternatives and modifications, some of which are discussed below.

Figure 3A:
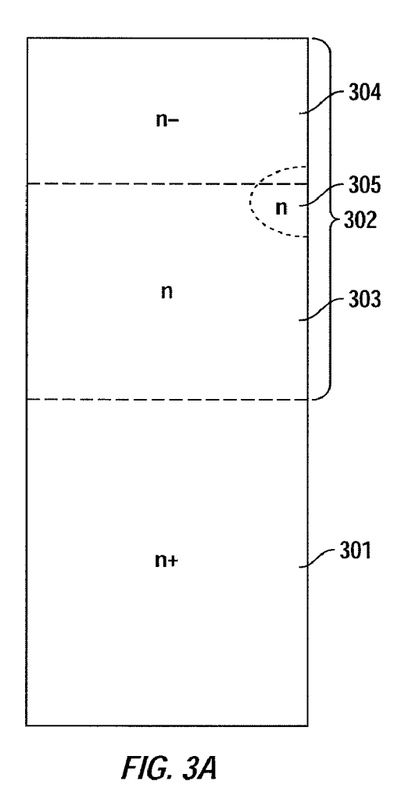
FIG. 3A-3J are simplified cross-section views illustrating a simplified process flow for manufacturing an LDMOS transistor characterized by vertically stacked LDD and sinker regions, according to an embodiment of the present invention.

FIGS. 3A-3J are cross-section views illustrating a simplified process flow for manufacturing the LDMOS transistor shown in FIG. 2, according to an embodiment of the present invention. In FIG. 3A, a semiconductor region 302 is formed over an n-type substrate 301. Substrate 301 preferably is heavily doped. Heavily doped substrates can be formed using conventional techniques or may be available commercially. In some embodiments, semiconductor region 302 is also n-type. Semiconductor region 302 can either be one continuous layer (e.g., one epitaxial layer) or may comprise multiple epitaxial layers. In the case where semiconductor region 302 comprises multiple epitaxial layers, each epitaxial layer may have a different doping concentration from the other depending on the design goals.

A highly doped sinker region 305 embedded in semiconductor region 302 may be formed using conventional implantation techniques. Sinker region 305 may extend across several epitaxial layers included in semiconductor region 302. In the embodiment shown, sinker region 305 extends into both lower epitaxial layer 303 and upper epitaxial layer 304. A hard mask (not shown) may be used to achieve the targeted implantation and formation of sinker region 305.

In a specific embodiment, lower epitaxial layer 303 is first formed over substrate 301. A masked implant step is carried out to implant n-type dopants into predefined regions of lower epitaxial layer 303 to form sinker region 305. Then, upper epitaxial layer 304 is formed over lower epitaxial layer 303. In an alternative embodiment, the sinker implant step can be carried out after both epitaxial layers 303 and 304 have been formed. In this case, a higher implant energy may be used to position the sinker region at the desired depth. An annealing step may follow the implantation step to allow sinker dopants to diffuse up into upper epitaxial layer 304 and also allow dopants from the n+ substrate 301 to diffuse up into lower epitaxial layer 303. The anneal step results in a dopant distribution that reduces electrical resistance, and also repairs any structural damage caused to the epitaxial layers during the implantation steps. The temperature cycles as well as the implant dopant type and concentration and the implant energy for forming the sinker region and the various LDD regions can be designed to ensure that in the final structure, sinker region 305 is in contact with lower LDD region 312, and lower LDD region 312 is in contact with upper LDD region 309, thus ensuring low $R_{DS(on)}$.

Figure 3B:
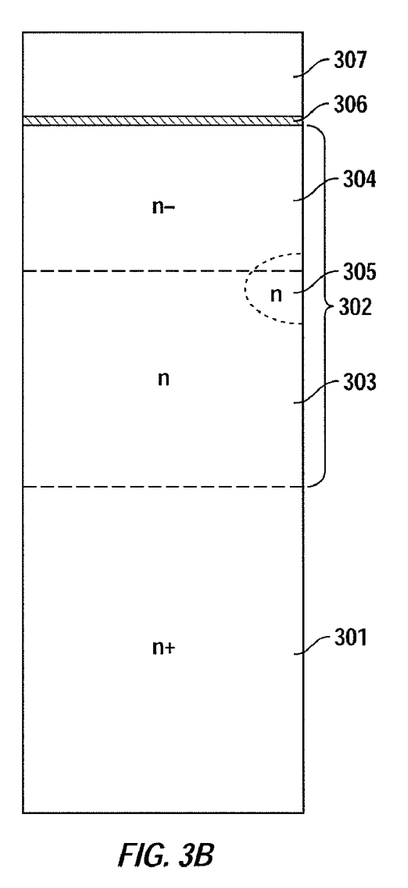
Figure 3C:
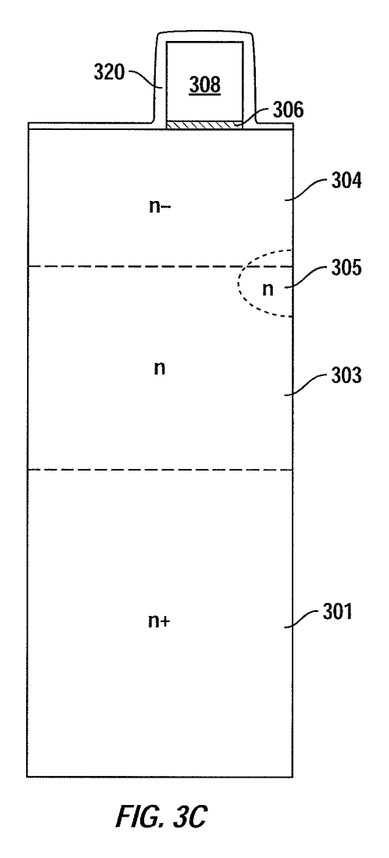

Next, a gate dielectric layer 306 is formed over upper epitaxial layer 304 as illustrated in FIG. 3B. Gate dielectric layer 306 can be formed using any known technique, e.g., a gate dielectric process. In one embodiment, gate dielectric layer 306 is formed by exposing the upper epitaxial later 304 to an oxidizing environment. Next, a polysilicon layer 307 is formed over gate dielectric layer 306. Polysilicon layer 307 is then selectively removed to form gate electrode 308 as illustrated in FIG. 3C. Optionally, a second insulating layer 320 can be formed over gate electrode 320 to seal the gate electrode from exposure to further processing steps. Insulating layer 320 can be formed, e.g., by oxidizing polysilicon gate 308. In an alternate embodiment, a silicide layer may be formed over the polysilicon layer prior to patterning the gate electrode.

Figure 3D:
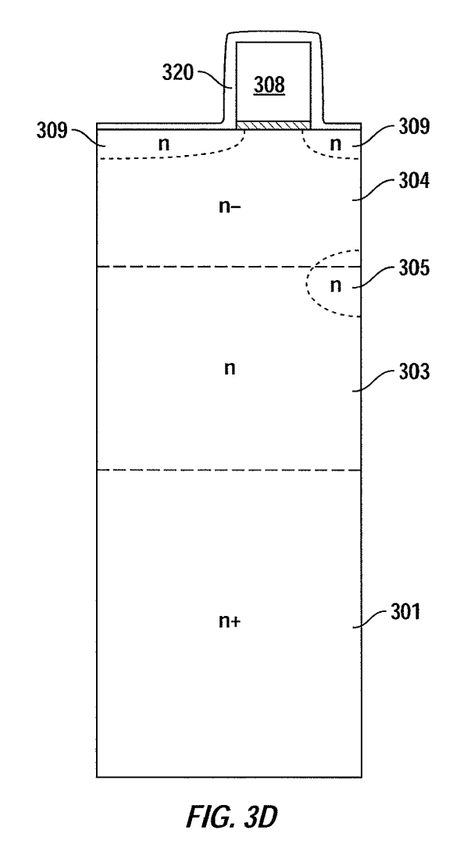

FIG. 3D illustrates the formation of upper LDD region 309. After forming gate electrode 308, upper epitaxial layer 304 is implanted with dopants to form upper LDD region 309 without using a masking layer. Upper LDD region 309 is thus self-aligned to gate electrode 308. Since no mask is used, dopants are implanted on both sides of gate electrode 308. However, the subsequent p-well and source implants will compensate the dopants implanted in this step on the source side of gate electrode 308. In one embodiment, the LDD dopant used is arsenic implanted with a dose of about 4E12 ions/cm$^2$ and the implant energy used is about 120 KeV. In an alternate embodiment, a masking layer may be used to shield the source side of gate 308 from being exposed to the dopants.

Figure 3E:
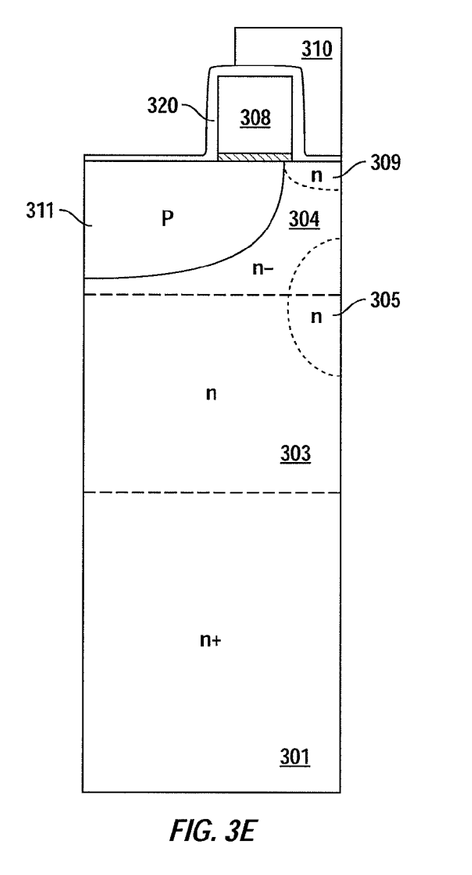
Figure 3F:
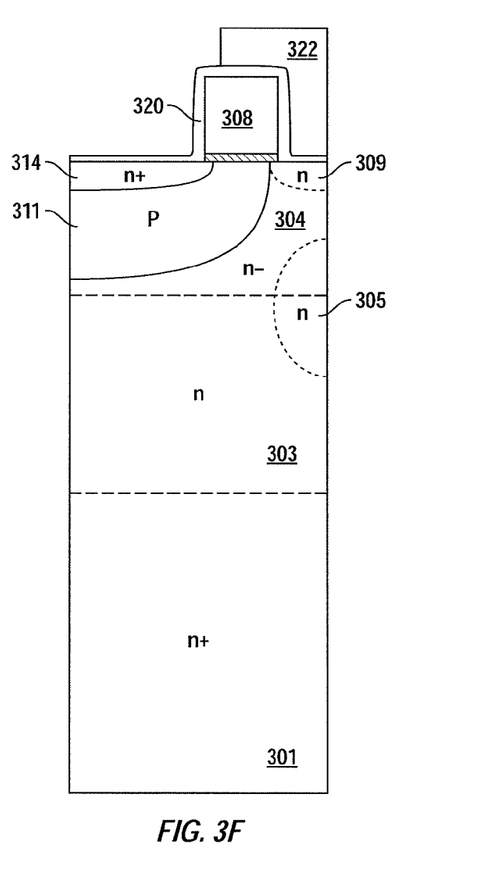

In FIG. 3E, a masking layer 310 is used to shield the drain side of gate electrode 308 and then another implant step is performed to form p-type well region 311. A well drive-in is then carried out. Any one of a number of know techniques may be used for the well implant and drive-in. Note that upper LDD region 309 can be formed after forming well region 311. In FIG. 3F, masking layer 322 (which may be the same masking layer used for well implant in FIG. 3E) is used to cover the drain side of gate electrode 308 during a source implant process for forming n-type source region 314. The source region is heavily doped with, e.g., arsenic or phosphorus using known techniques.

Figure 3G:
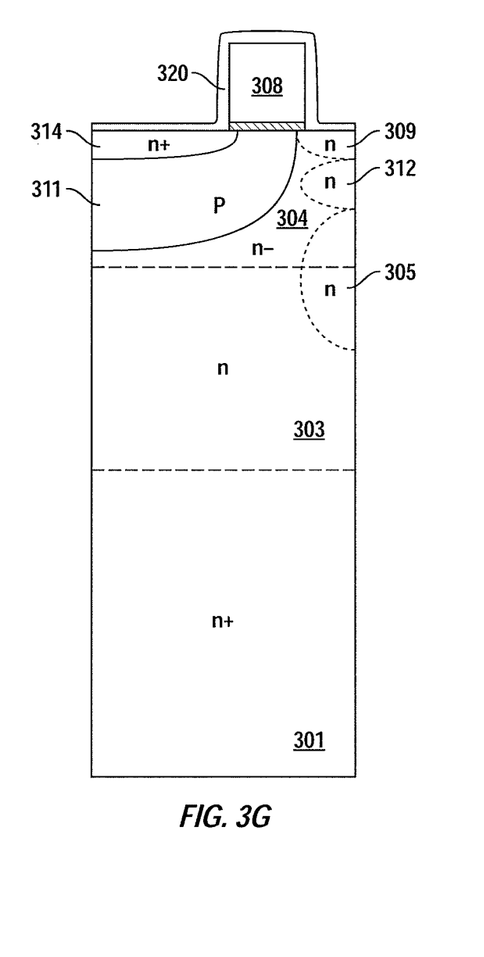

In FIG. 3G, an LDD implant is carried out to form lower LDD region 312 without using a mask. Lower LDD region is thus self-aligned to gate electrode 308. Lower LDD region 312 has a higher dopant concentration and is implanted at a higher energy than upper LDD region 309. The upper and lower LDD regions 309, 312 are formed such that the upper and lower LDD regions 309, 312 and sinker region 305 all form a vertical stack as shown. In one embodiment, lower LDD region 312 is formed with phosphorus at a dose of about 2.7E13 ions/cm$^2$ and an energy of about 170 KeV. In an alternate embodiment, lower LDD region 312 can also be formed using a mask which prevents the LDD dopants from getting into the source side of gate electrode 308, if needed.

In one embodiment, the substrate is doped heavily with phosphorous, and the lower epitaxial layer is doped with arsenic and serves as a cap layer to control the up-diffusion of dopants from the substrate. In this embodiment, the sinker region and the upper LDD region are formed using arsenic dopants, and the lower LDD region is formed using phosphorous. With proper heat cycles, this combination of dopant types together with appropriate dopant concentrations and energies ensures that the sinker region and the upper and lower LDD regions come in contact with one another in order to minimize the $R_{DS(on)}$, without excessive lateral diffusion of the LDD regions.

Figure 3H:
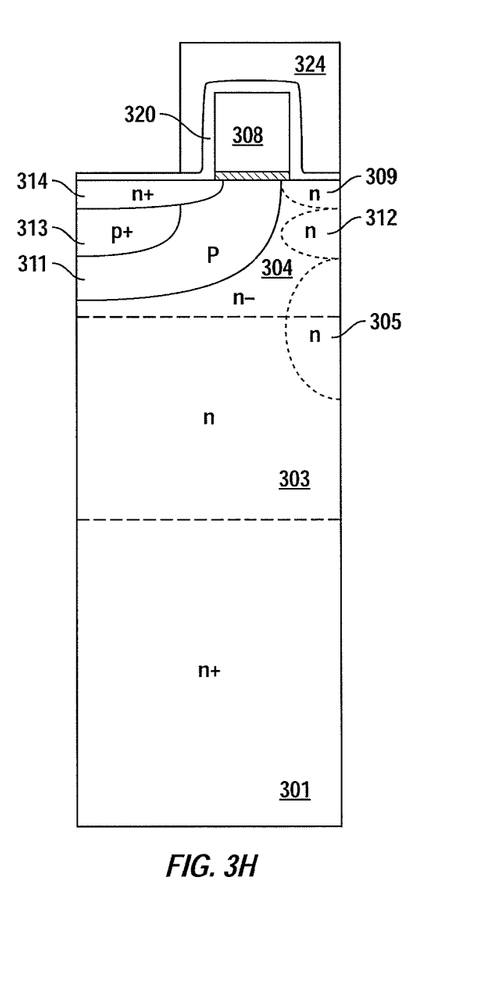
Figure 3I:
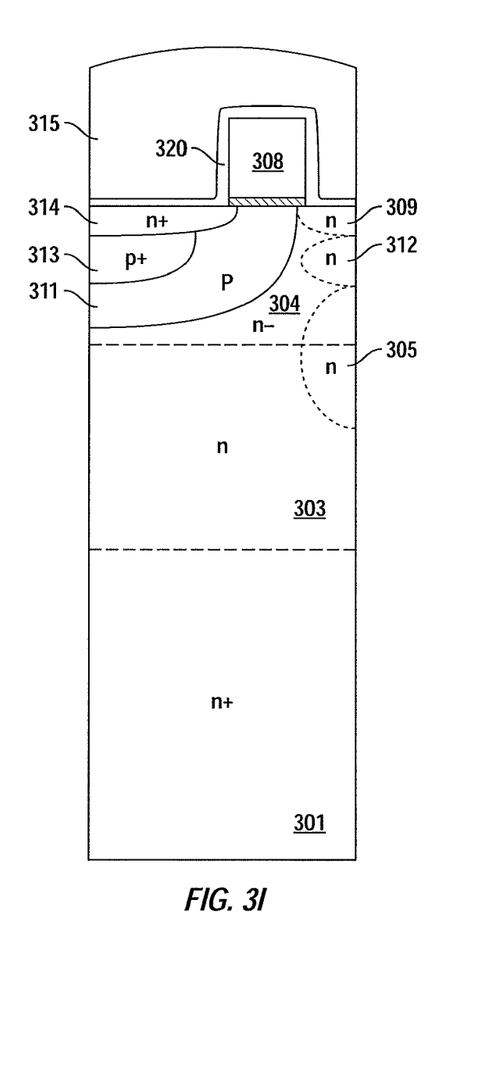
Figure 3J:
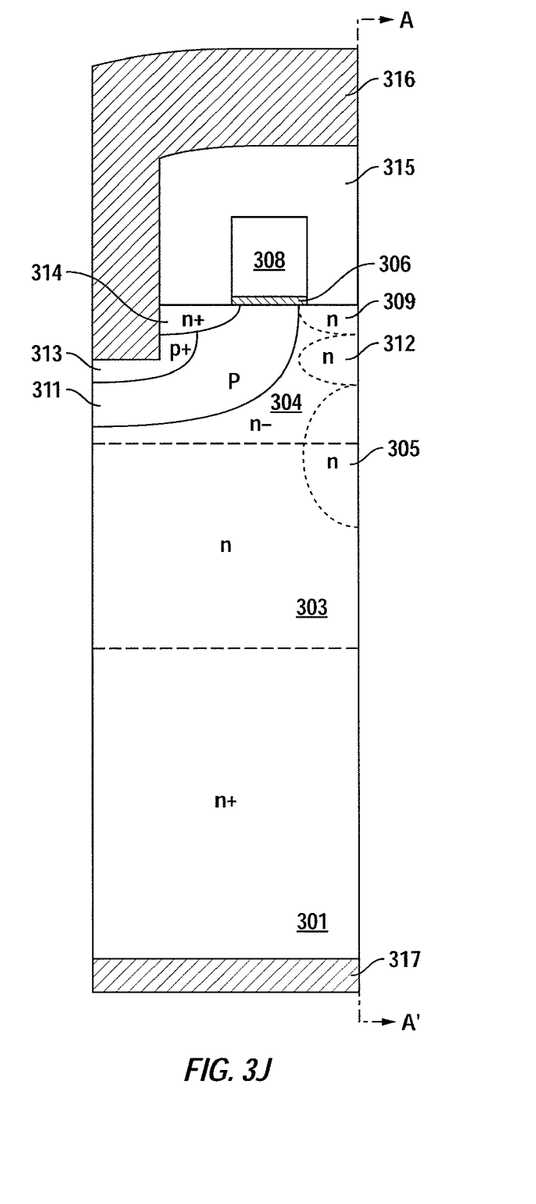

Next, in FIG. 3H, a masking layer 324 is used to define a window through which heavy body dopants are implanted into body region 311 to thereby form heavy body region 313. In FIG. 3I, a dielectric layer 315 is formed over gate electrode 308 using conventional techniques. In one embodiment, dielectric layer 315 comprises BPSG. In FIG. 3J, a portion of dielectric layer 315 is removed and a heavy body recess extending through source region 314 and terminating within heavy body region 313 is formed using known techniques. A source interconnect layer 316 is then formed over dielectric layer 315 using conventional methods. Source interconnect layer 316 makes contact with source region 314 and heavy body region 313. Interconnect layer 316 can be formed of any suitable metal such as aluminum, copper, refractory metal, metal silicide, or the like. In an alternate embodiment, heavy body region 313 is formed after forming the heavy body recess by implanting dopants along the bottom of the heavy body recess. Finally, a drain interconnect 317 is formed on the backside of the substrate thus completing the transistor structure.

It should be noted that although FIGS. 3A-3J illustrate a particular sequence of steps in forming an LDMOS field effect transistor, other sequences or steps may also be performed according to alternative known techniques. Moreover, the individual steps illustrated in FIGS. 3A-3J may include multiple sub-steps that may be performed in various sequences as appropriate to the individual step. Furthermore, additional steps may be added or removed depending on the particular design. One of ordinary skill in the art would recognize many variations, modifications, and alternatives in view of this disclosure.

Figure 4:
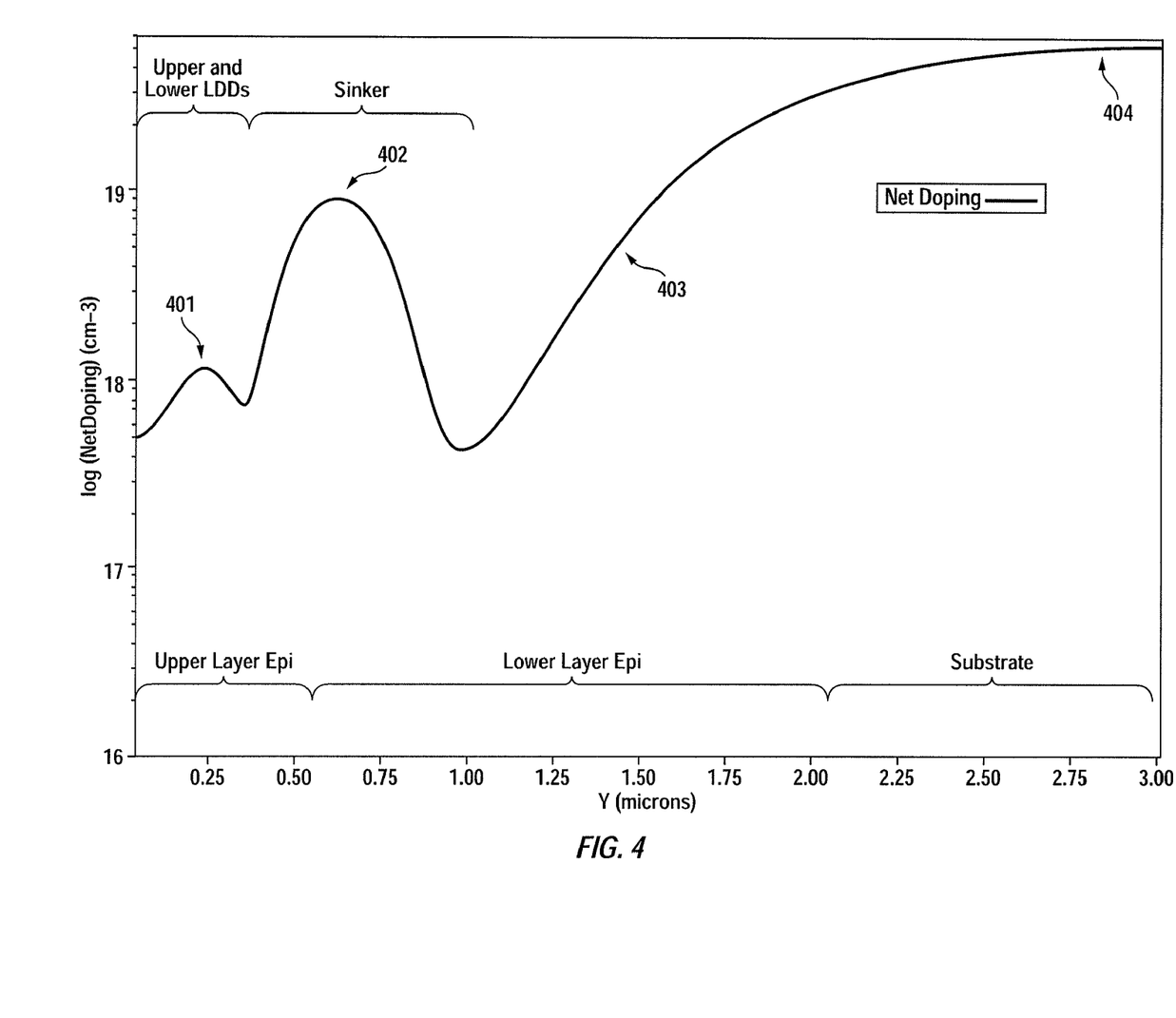
FIG. 4 shows an exemplary doping profile for an LDMOS transistor according to an embodiment of the present invention.

FIG. 4 shows an exemplary doping profile along line A-A' in FIG. 3J. In FIG. 4, the horizontal axis from left to right corresponds to the vertical dimension from the upper surface of semiconductor region 302 to substrate 301. It can be seen that the upper epitaxial layer extends to a depth of about 0.55 µm. The second epitaxial layer has a thickness of about 1.5 µm and extends from a depth of about 0.55 µm to about 2.05 µm. A portion of the substrate is shown from about 2.05 µm to 3.00 µm.

In FIG. 4, reference numeral 401 is used to identify the general location of the upper and lower LDD regions, and reference numeral 402 is used to identify the general location of the sinker region. As can be seen, the sinker region has a peak concentration near the top surface of the upper epitaxial layer where the sinker dopants are implanted. Subsequent thermal cycles cause the sinker dopants to diffuse up into the upper epitaxial layer. During the various thermal cycles, dopants from the heavily doped substrate 404 also diffuse up into the lower epitaxial layer resulting in the graded dopant profile marked in FIG. 4 by reference numeral 403. The exemplary doping profile in FIG. 4 advantageously reduces the transistor on-resistance $R_{DS(on)}$ while maintaining the desired breakdown voltage. It is appreciated that the particular dopant profile illustrates only a specific example according to one embodiment of the invention, and process conditions can be adjusted to tailor the dopant profile and electrical resistivity of the various regions to meet the requirement of specific designs. For example, depending on the desired break down voltage and $R_{DS(on)}$, the doping concentration of the two LDD regions may be adjusted, or only one LDD region instead of two may be used, or alternatively three or more LDD regions formed in two or more epitaxial layers may be used.

Many advantages are realized by this invention. For example, by stacking the LDD and sinker regions in a vertical orientation, it is possible to reduce the cell pitch thus increasing the number of cells that can be accommodated in a given die size. As another example, due to the capability of adjusting the doping concentrations of the LDD and sinker regions, it is possible to control the overall resistance of these regions. This further helps to tune the $R_{DS(on)}$ to provide improved switching characteristics for the transistor. In addition, the embodiments described above provide LDD regions that are self-aligned to the drain side of the gate electrodes and thus can reduce process complexity and cost. In one specific embodiment a cell pitch reduction from 2.0-2.2 um for a comparable conventional LDMOS transistor to about 1.2 um for a LDMOS formed using the techniques of the present invention was obtained.

While the above is a complete description of specific embodiments of the present invention, various modifications, variations, and alternatives may be employed. For example, although silicon is given as an example of a substrate material, other materials may be used. Furthermore, implantation is given as an example of introducing dopants, but other doping methods, such as a gas or topical dopant source may be used to provide dopants for diffusion, depending on the appropriate mask being used. Moreover, while the process sequences depicted by FIGS. 3A-3J are for n-channel FETs, modifying these process sequences to form p-channel FETs would be obvious to one skilled in the art in view of this disclosure. Hence, the scope of this invention should not be limited to the embodiments described, but are instead defined by the following claims.

What is claimed is:

1. A field effect transistor comprising:
 a semiconductor region of a first conductivity type having an upper surface and a lower surface, the lower surface of the semiconductor region extending over and abutting a substrate;
 well regions of a second conductivity type disposed within the semiconductor region;
 source regions of the first conductivity type disposed in the well regions;
 a gate electrode extending over each well region and overlapping a corresponding one of the source regions, each gate electrode being insulated from the underlying well region by a gate dielectric;
 at least one LDD region of the first conductivity type disposed in the semiconductor region between every two adjacent well regions such that the at least one LDD region is in contact with the two adjacent well regions between which it is disposed; and
 a sinker region disposed in the semiconductor region directly underneath the at least one LDD region such that the at least one LDD region and the sinker region are positioned along a vertical orientation between the upper and lower surfaces of the semiconductor region, the sinker region having a higher dopant concentration than the at least one LDD region, wherein a portion of the sinker region extends laterally in the semiconductor region underneath the gate electrode and beyond an edge of the gate electrode.

2. The field effect transistor of claim 1 wherein the at least one LDD region is self-aligned to gate electrodes between which it is disposed.

3. The field effect transistor of claim 1 wherein the sinker region is fully embedded in the semiconductor region so that it does not reach the upper surface of the semiconductor region.

4. The field effect transistor of claim 1 wherein the semiconductor region comprises two or more epitaxial layers.

5. The field effect transistor of claim 4 wherein the semiconductor region comprises an upper epitaxial layer and a lower epitaxial layer having different dopant concentrations.

6. A field effect transistor comprising:
a semiconductor region of a first conductivity type having an upper surface and a lower surface, the lower surface of the semiconductor region extending over and abutting a substrate;
well regions of a second conductivity type disposed within the semiconductor region;
source regions of the first conductivity type disposed in the well regions;
a gate electrode extending over each well region and overlapping a corresponding one of the source regions, each gate electrode being insulated from the underlying well region by a gate dielectric;
at least one LDD region of the first conductivity type disposed in the semiconductor region between every two adjacent well regions such that the at least one LDD region is in contact with the two adjacent well regions between which it is disposed; and
a sinker region disposed in the semiconductor region directly underneath the at least one LDD region such that the at least one LDD region and the sinker region are positioned along a vertical orientation between the upper and lower surfaces of the semiconductor region, the sinker region having a higher dopant concentration than the at least one LDD region, wherein a portion of the sinker region extends laterally in the semiconductor region underneath the gate electrode and beyond an edge of the gate electrode;
wherein the at least one LDD region forms an upper LDD region, the field effect transistor further comprising a lower LDD region of the first conductivity type disposed in the semiconductor region directly underneath the upper LDD region and directly above the sinker region.

7. The field effect transistor of claim 6 wherein the lower LDD region has a higher dopant concentration than the upper LDD region, and is self-aligned to gate electrodes between which it is disposed.

8. A field effect transistor comprising:
a semiconductor region of a first conductivity type having an upper surface and a lower surface, the lower surface of the semiconductor region extending over and abutting a substrate;
a well region of a second conductivity type disposed within the semiconductor region;
a source region of the first conductivity type disposed in the well region;
a gate electrode extending over the well region and overlapping the source region, the gate electrode being insulated from the well region by a gate dielectric;
an upper LDD region of the first conductivity type disposed in the semiconductor region adjacent to and in contact with the well region, the upper LDD region being self-aligned to the gate electrode;
a lower LDD region of the first conductivity type disposed in the semiconductor region directly underneath but in contact with the upper LDD region, the lower LDD region being self-aligned to the gate electrode; and
a sinker region disposed in the semiconductor region directly underneath but in contact with the lower LDD region such that the upper and lower LDD regions and the sinker region are positioned along a vertical orientation between the upper and lower surfaces of the semiconductor region, the sinker region having a higher dopant concentration than the upper and lower LDD regions.

9. The field effect transistor of claim 8 wherein the sinker region is fully embedded in the semiconductor region so that it does not reach the upper surface of the semiconductor region.

10. The field effect transistor of claim 8 wherein the semiconductor region comprises an upper epitaxial layer and a lower epitaxial layer, the upper epitaxial layer having a lower doping concentration than the lower epitaxial layer, and the lower epitaxial layer having a lower doping concentration than the substrate.

11. The field effect transistor of claim 10 wherein the sinker region extends through both the upper and lower epitaxial layers, and both the upper and lower LDD regions extend in the upper epitaxial layer only.

12. The field effect transistor of claim 8 wherein a portion of the sinker region extends laterally in the semiconductor region directly underneath the gate electrode.

* * * * *